United States Patent [19]
Tsai et al.

[11] Patent Number: 5,814,530
[45] Date of Patent: Sep. 29, 1998

[54] PRODUCING A SENSOR WITH DOPED MICROCRYSTALLINE SILICON CHANNEL LEADS

[75] Inventors: Chuang-Chuang Tsai, San Jose; William W. Yao, Los Altos; Ronald T. Fulks, Mountain View, all of Calif.

[73] Assignee: Xerox Corporation, Stamford, Conn.

[21] Appl. No.: 721,813

[22] Filed: Sep. 27, 1996

[51] Int. Cl.[6] .................................................. H01L 21/00
[52] U.S. Cl. ............................... 438/30; 438/50; 438/151
[58] Field of Search .................................... 437/2, 21, 40, 437/41; 438/149, 158, 30, 50, 151

[56] References Cited

U.S. PATENT DOCUMENTS

| | | | |
|---|---|---|---|
| 5,348,892 | 9/1994 | Miyake et al. ............................... | 437/2 |
| 5,360,744 | 11/1994 | Shimizu et al. ............................. | 437/2 |
| 5,473,168 | 12/1995 | Kawai et al. ............................... | 257/61 |
| 5,480,818 | 1/1996 | Matsumoto et al. ............... | 437/40 TFT |
| 5,516,712 | 5/1996 | Wei et al. .................................. | 437/40 |

FOREIGN PATENT DOCUMENTS

| | | |
|---|---|---|
| 0535979 | 4/1993 | European Pat. Off. . |
| 2197985 | 6/1988 | United Kingdom . |

OTHER PUBLICATIONS

R. A. Street, C. C. Tsai, J. Kakalios and W. B. Jackson, "Hydrogen Diffusion in Amorphous Silicon", *Philosophical Magazine B.*, 1987, vol. 56, No. 3, pp. 305–320. Month unknown.

C. C. Tsai, R. Thompson, C. Doland, F. A. Ponce, G. B. Anderson and B. Wacker, "Transition from Amorphous to Crystalline Silicon: Effect of Hydrogen on Film Growth", *Materials Research Society Symposium Proceedings*, vol. 118, 1988, pp. 49–54. Month unknown.

Chuang Chuang Tsai, "Amorphous Silicon and Related Materials", *World Scientific Publishing Company*, 1989, pp. 123–147. Month unknown.

*Primary Examiner*—John Niebling
*Assistant Examiner*—Michael S. Lebentritt

[57] ABSTRACT

In producing a sensor device with a sensing element and a thin film transistor, a semiconductor layer with microcrystalline silicon ($\mu$c-Si) is produced in which semiconductor channel leads are formed. The $\mu$c-Si has a structure that prevents formation of bubbles at the sides of the semiconductor layer during subsequent production of a sensing element in a silicon-based layer. The semiconductor layer can be a deposited doped layer of $\mu$c-Si, or a layer of intrinsic $\mu$c-Si can be doped. The $\mu$c-Si layer can be deposited with a sufficiently small amount of hydrogen to prevent formation of bubbles; it can be deposited with crystalline grain structures permitting hydrogen to dissipate at a sufficient rate to prevent formation of bubbles; or its interfaces can be formed with sufficiently stability to prevent formation of bubbles.

3 Claims, 10 Drawing Sheets

PRODUCING A SENSOR WITH DOPED MICROCRYSTALLINE SILICON CHANNEL LEADS

BACKGROUND OF THE INVENTION

The present invention relates to production of sensor devices.

FIG. 1 shows an example of a prior art sensor array, formed at a surface of glass substrate 10. Gate 12 conventionally includes highly conductive metal and is connected to a scan line for receiving signals that control conductivity of a thin film transistor (TFT).

Insulating layer 20, conventionally silicon nitride (SiN), separates gate 12 from intrinsic semiconductor layer 22, the layer in which the TFT's channel is formed. Semiconductor layer 22 is conventionally amorphous silicon (a-Si), and it is covered in the channel region by insulating island 24, conventionally formed in another layer of SiN. The channel therefore extends from a connecting region at one side of island 24 to another connecting region at the other side of island 24.

Doped semiconductor layer 30 and conductive metal layer 32 are patterned to form channel leads for the TFT, and an opening is therefore formed over island 24 so that the channel leads are isolated. Doped semiconductor layer 30 includes one semiconductor lead in electrical contact with the connecting region at one side of island 24 and another semiconductor lead in electrical contact with the connecting region at the other side of island 24. For process compatibility, doped semiconductor layer 30 is conventionally heavily n-doped (n+) a-Si, while conductive metal layer 32 can be sputtered chromium.

Silicon-based sensor layer 40 is formed over metal layer 32 and acts as a diode. Sensor layer 40 can be formed in a conventional p-i-n layer or a Schottky diode layer, deposited in either case by plasma-enhanced chemical vapor deposition (PECVD), conventionally performed at temperatures greater than 180° C., typically between 200°–350° C.

Over sensor layer 40, FIG. 1 also shows electrode layer 42, conventionally a layer of indium-tin-oxide (ITO), and lower passivation layer 44, conventionally a layer of silicon-based dielectric. Layer 44 is patterned to form openings to metal layer 32 on one side of the TFT and to ITO layer 42 on the other side. Then another conductive metal layer is deposited and patterned to provide data line 50 and bias line 52, connected respectively to metal layer 32 and ITO layer 42 through the openings. Finally upper passivation layer 46 covers the array, and is conventionally another layer of silicon-based dielectric.

Kanicki, J., Hasan, E., Griffith, J., Takamori, T., and Tsang, J. C., "Properties of High Conductivity Phosphorous Doped Hydrogenated Microcrystalline Silicon and Application in Thin Film Transistor Technology," Mat. Res. Soc. Symp. Proc., Vol. 149, 1989, pp. 239–246, describe techniques for phosphorous (P) doping of microcrystalline silicon ($\mu$c-Si:H). At pages 239 and 245, Kanicki et al. describe use of a heavily (n+) P-doped $\mu$c-Si:H layer in a hydrogenated amorphous silicon (a-Si:H) thin film transistor (TFT) as a contact interlayer between a source/drain metal and a-Si:H layer. At page 239, Kanicki et al. mention application in sensing elements for integrated sensors. Beginning at page 240, Kanicki et al. describe preparation of n+ $\mu$c-Si:H films by 13.56 MHz rf glow discharge decomposition of silane, phosphine, and hydrogen gas mixture, mentioning at page 241 that the hydrogen content decreases with increasing deposition temperatures, with higher temperature films containing less than 0.5 at. % of hydrogen, as shown in FIG. 3. At pages 245 and 246, Kanicki et al. describe bulk properties, contact properties, and application of an interlayer of $\mu$c-Si:H between source/drain metal and a-Si:H in a TFT structure.

Lustig, N., and Kanicki, J., "Gate dielectric and contact effects in hydrogenated amorphous silicon-silicon nitride thin-film transistors," J. Appl. Phys., Vol. 65, May 1989, pp. 3951–3957, describe improvement in TFT mobility upon replacement of phosphorous doped (n+) hydrogenated amorphous silicon (a-Si:H) by n+ hydrogenated microcrystalline silicon ($\mu$c-Si:H) in source-drain contact fabrication. Section II on pages 3951 and 3952 describes an experiment that included a thin n+ $\mu$c-Si:H layer between source-drain metal and intrinsic a-Si:H, to insure ohmic contacts. The n+ $\mu$c-Si:H was deposited from a $PH_3/SiH_4$ mixture in $H_2$ yielding an approximately 0.1-$\Omega$ cm material. The upper part of FIG. 1 shows a schematic cross section of a resulting transistor. As shown and described in relation to FIG. 5, average field-effect mobility increased with n+ $\mu$c-Si:H.

Kawai et al., U.S. Pat. No. 5,473,168, describe a thin film transistor (TFT) used as a switching element for selectively switching a pixel electrode for an active matrix liquid crystal display. The TFT includes a substrate, a gate electrode on the substrate, a semiconductor layer insulated from the gate electrode, first and second contact layers of n-type microcrystalline silicon having a resistivity of 10 $\Omega$cm or less, a source electrode in contact with part of the first contact layer, and a drain electrode in contact with part of the second contact layer. Various examples are shown and described in relation to FIGS. 1–41. As described in relation to FIGS. 1 and 2, for example, phosphorous doped n+-type microcrystalline silicon ($\mu$c-Si(n+)) is deposited by plasma CVD in an atmosphere of monosilane, phosphine, and hydrogen to a thickness of 50 nm.

SUMMARY OF THE INVENTION

The invention addresses a problem that arises in producing structures like that described above in relation to FIG. 1. The thermal cycle of PECVD deposition of silicon-based sensor layer 40 includes temperatures comparable to those at which previous silicon-based layers were deposited, causing gas to migrate out of the previous layers. The gas may form bubbles between layers. For example, bubbles may form at the sides of doped semiconductor layer 30 because heat causes hydrogen from layer 30 to travel to interfaces with other layers where the hydrogen becomes trapped. Such bubbles cause defects in the resulting structure, such as film peeling, or delamination, and particle generation which lead to a degradation in yield and reliability.

The invention is based on the discovery of a new technique that solves the bubble formation problem. The new technique produces a structure in which doped semiconductor channel leads are formed in a layer of microcrystalline silicon ($\mu$c-Si). The $\mu$c-Si layer has a structure that prevents bubble formation during the subsequent production of a sensing element in another silicon-based layer.

The new technique can be implemented as an improved method of producing a sensor device of the type that includes a silicon-based sensing element and a TFT. The TFT includes a gate lead, first and second channel leads, and a channel. The channel is formed in a first semiconductor layer and extends between a first connecting region and a second connecting region; the first semiconductor layer includes intrinsic silicon-based material. The first and second channel leads include first and second semiconductor leads formed in a second semiconductor layer, with the first semiconductor lead in electrical contact with the first connecting region and the second semiconductor lead in electrical contact with the second connecting region; the second semiconductor layer includes doped silicon-based material. The sensing element is formed in a third semiconductor layer which also includes silicon-based material, over the second semiconductor layer.

The improved method, in producing the second semiconductor layer, deposits a layer of μc-Si. The improved method then produces the sensing element in the third semiconductor layer. The μc-Si layer has a structure that prevents formation of bubbles at the lower and upper sides of the second semiconductor layer during the act of producing the sensing element.

The improved method can produce the μc-Si layer with a structure that prevents bubble formation in a number of ways. For example, the method can deposit the μc-Si layer with a sufficiently small amount of hydrogen that bubbles do not form during subsequent thermal cycles; for example, the μc-Si can include less than 5 at. % of hydrogen, such as 1—3 at. % or less, and has been implemented with 2–3 at. % of hydrogen. Also, the method can deposit the μc-Si layer with grain structures that permit hydrogen to dissipate rather than forming bubbles at the interfaces of the μc-Si layer. Also, the method can form sufficiently stable interfaces at the lower and upper sides of the second semiconductor layer that bubbles cannot form at the interfaces; for example, the upper side of the second semiconductor layer can be cleaned before forming an interface with a layer of source/drain metal at the upper side.

The new technique can also be implemented in a method that forms a gate lead; deposits a first insulating layer over the gate lead; deposits a first semiconductor layer with intrinsic silicon-based material over the first insulating layer; and deposits and patterns a second insulating layer to form an insulating island over a channel region. The method can then deposit a second semiconductor layer including doped μc-Si over the insulating island and over first and second connecting regions between which the channel region extends. The method can then deposit a conductive metal layer over the second semiconductor layer; deposit a third semiconductor layer with silicon-based material over the conductive metal layer; pattern the third semiconductor layer to form a sensing element; and patterns the conductive metal layer and the second semiconductor layer to form channel leads of a TFT with a channel formed in the channel region. The method is performed so that the second semiconductor layer has a structure that prevents formation of bubbles at the sides of the second semiconductor layer during deposition and patterning of the third semiconductor layer.

The new technique can also be implemented in a method that forms a gate lead; deposits a first insulating layer over the gate lead; deposits a first semiconductor layer with intrinsic μc-Si over the first insulating layer; and deposits and patterns a second insulating layer to form an insulating island over a channel region. The method can then dope exposed parts of the first semiconductor layer using the insulating island as a mask so that first and second conductive regions are formed immediately adjacent first and second connecting regions between which the channel region extends. The method can then deposit a conductive metal layer over the first semiconductor layer; deposit a second semiconductor layer with silicon-based material over the conductive metal layer; pattern the second semiconductor layer to form a sensing element; and pattern the conductive metal layer and the first semiconductor layer to form channel leads of a TFT with a channel formed in the channel region. The method is performed so that the first semiconductor layer has a structure that prevents formation of bubbles at the sides of the first semiconductor layer during deposition and patterning of the second semiconductor layer.

The new technique described above is advantageous because it reduces bubble formation. In addition, the new technique may allow a broader choice of materials and process conditions for deposition of layers, resulting in an increase in throughput, yield and reliability.

The following description, the drawings, and the claims further set forth these and other aspects, objects, features, and advantages of the invention.

DETAILED DESCRIPTION

A. Conceptual Framework

Figure 1:
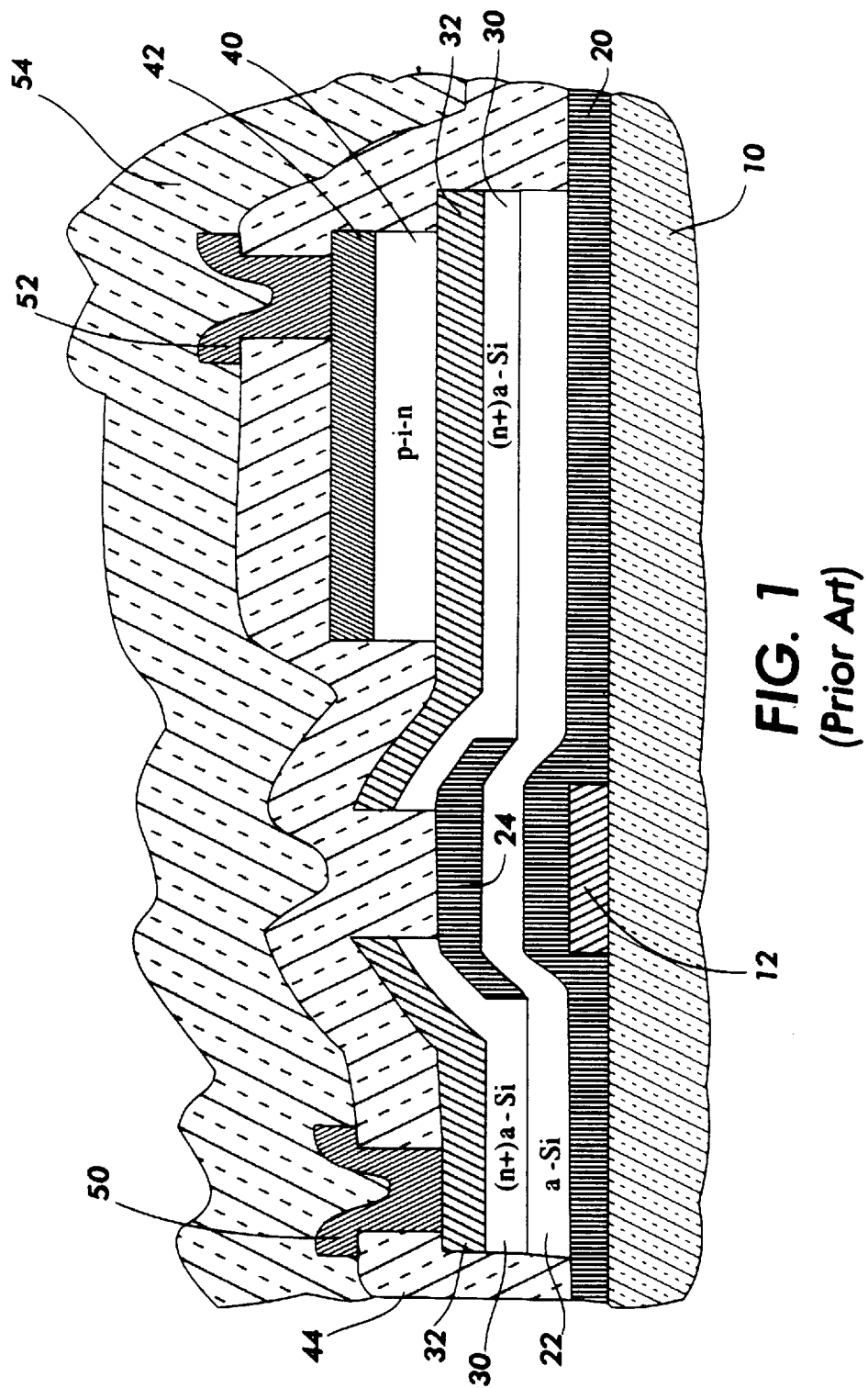
FIG. 1 is a cross section showing a prior art sensor device.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal provides information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not physically connected, such as through a capacitive coupling.

When circuitry transfers a signal from a first component to a second component, the first component "provides" the signal, and the second component "receives" the signal.

An "electric circuit" is a circuit within which components are electrically connected. An "electric structure" is a physical structure that includes one or more electric circuits.

A "substrate" or "chip" is a unit of material that has a surface at which circuitry can be formed or mounted.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "sputter from" a solid material is to bombard the solid material with energetic ions so that atoms from the solid material are dislodged by direct momentum transfer, making it possible to deposit the dislodged atoms elsewhere. The solid material may be referred to as a "target."

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" or "PECVD" uses a plasma energy source. A "PECVD layer" is a layer produced by PECVD.

An operation "deposits" a layer by depositing material to form the layer, such as by physical or chemical vapor deposition.

To "pattern" a layer is to remove parts of the layer to form a pattern. To "etch" a layer is to remove unmasked material using a material referred to as an "etch ant."

A "patterned layer" is a layer that forms a pattern. For example, a patterned layer may be formed by removing part of a layer to form a pattern or by depositing a layer in a pattern. To perform "lithography" or to "lithographically pattern" is to use a radiation source to transfer a mask pattern to a layer of radiation-sensitive material and then to develop the radiation-sensitive material to obtain a positive or negative copy of the mask pattern. The radiation-sensitive material is referred to as "resist" or "photoresist." If it is to be used for etching, a pattern of resist that results from development may be referred to as a "pattern of mask material" or simply a "mask."

A "lithographically patterned layer" is a layer in which a pattern has been formed by performing lithography to produce a pattern of mask material and by then etching away either the part of the layer that is not covered by the pattern or the part that is covered.

An operation "forms" a lithographically patterned layer or circuitry in a lithographically patterned layer by performing lithography to produce a pattern of mask material and then etching away either the part of the layer that is not covered by the pattern or the part that is covered.

A "thin-film structure" is an electric structure that is formed at a surface of an insulating substrate. A thin-film structure could be formed, for example, by depositing and lithographically patterning films on the insulating substrate's surface.

A "charge carrier" is a real or fictitious particle that can transport charge to produce a current; electrons and holes are examples of charge carriers. A "charge carrier source" is an ion, atom, molecule, or other feature that can provide a charge carrier.

A "dopant particle" or "dopant" is an ion, atom, molecule, or other particle that can be added to a part of an electric structure during production and that serves as a charge carrier source when the electric structure is in use. An "n-type dopant" provides charge carriers of negative sign and a "p-type dopant" provides charge carriers of positive sign.

A process "implants" a dopant into a part of a layer if the process causes particles of the dopant to enter the part of the layer. Implanting therefore includes both conventional ion implantation and also "ion shower" doping.

In a structure at a surface, a part of a first layer "covers" or "is over" a part of a second layer if the part of the second layer is between the part of the first layer and the surface. A part of a first layer is "formed on" a part of a second layer if the part of the first layer has a lower side that meets the upper side of the part of the second layer at an interface between the first and second layers.

A part of a mask or other covering layer "prevents" dopant particles from entering a covered part of another layer if the part of the mask or other covering layer absorbs or blocks dopant particles following a trajectory toward the covered part of the other layer.

A layer or part of a layer is "doped" if it contains dopant and "undoped" or "intrinsic" if it does not.

An operation "deposits a doped layer" if the operation deposits the layer so that it contains dopant when deposited. Such a layer may be referred to as a "deposited doped layer" to contrast it with a layer that is doped after deposition.

An "integrated circuit" is a circuit formed at a substrate's surface by batch processes such as deposition, lithography, etching, oxidation, diffusion, implantation, annealing, and so forth.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected by a combination of leads and lines. In an integrated circuit, leads of two components may also be "connected" by being formed as a single lead that is part of both components.

A "conductive layer" is a layer formed of conductive material.

A "semiconductor layer" is a layer formed of semiconductor material. If doped, a semiconductor layer may also be a conductive layer.

An "insulating layer" is a layer formed of a nonconductive material.

In a thin film structure, the terms "gate region," "gated region," and "channel" have related meanings: A "gate region," sometimes called a "gate," is a part of a layer that controls conductivity of a "gated region" that is part of another layer, typically defined by the projection of the gate region onto the other layer; conversely, a "gated region" is a part of a layer with conductivity that changes depending on the gate region; a "channel" is formed when current flows through a gated region. A channel is "highly conductive" or "ON" when the channel is in a state in which current can flow freely through it. A channel is "OFF" when the channel is in a state in which very little current can flow through it.

A "transistor" is a component that has a channel or a series of channels that extends between two channel leads, and that also has a third lead—referred to as a "gate lead" or simply "gate"—such that the channel or series of channels can be switched between ON and OFF by signals that change potential difference between the gate and one of the channel leads, referred to as the "source." The channel lead that is not the source is referred to as the "drain." Other components may have leads called gates, sources, and drains by analogy to transistors. Other components may have leads called gates, sources, and drains by analogy to transistors.

A "semiconductor channel" is a channel formed in a semiconductor layer.

A "thin-film transistor" or "TFT" is a transistor that is part of a thin-film structure.

A "crystalline grain structure", or simply "grain structure", in a material is a crystalline part of the material. A "grain size" is a size of a crystalline grain structure or a size representative of a collection of crystalline grain structures.

As used herein, "microcrystalline silicon" or "$\mu$c-Si" means silicon formed with crystalline grain structures that have grain sizes greater than 20 Å. $\mu$c-Si can be distinguished from amorphous silicon (a-Si) based on presence of crystalline grain structures—true amorphous silicon does not include crystalline grain structures. Crystalline grain structures can be observed, for example, by Raman scattering, by transmission electron microscopy (TEM), by scanning electron microscopy (SEM), or by x-ray diffraction. Doped $\mu$c-Si can also be distinguished from doped a-Si by electrical measurements such as sheet resistivity—doped a-Si has higher resistivity. In contrast with conventional polycrystalline silicon (poly-Si), both $\mu$c-Si and a-Si are typically produced by low temperature processes in which substrate temperatures do not exceed 350° C., such as PECVD, including remote plasma PECVD, sputtering, and evaporation with an unheated or lightly heated substrate. Various parameters can be adjusted to determine whether a-Si or $\mu$c-Si is produced, including ratio of $H_2$, gas pressure, rf power, and so forth. In contrast with $\mu$-Si and a-Si, poly-Si has sharp grain boundaries and is substantially hydrogen free. Poly-Si is typically produced by low pressure CVD (LPCVD), by high temperature PECVD, or by post annealing of a-Si. $\mu$c-Si therefore includes more hydrogen than poly-Si and has a larger distribution of grain sizes.

A "silicon-based material" is a material in which silicon is a major component. Examples include crystalline silicon, a-Si, $\mu$c-Si, poly-Si, silicon nitride, silicon carbide, silicon-germanium alloys, and so forth.

A "channel lead" is a lead. that connects to a channel. A channel may, for example, extend between two "connecting regions" that are electrically connected to two channel leads.

A part of a layer is "in electrical contact with" a part of another layer if the two parts meet in such a way that they are electrically connected. For example, a semiconductor channel lead can be in electrical contact with a connecting region at an end of a semiconductor channel if the semiconductor channel lead is either immediately over or under the connecting region in another layer or is immediately adjacent the connecting region in the same layer. Similarly, a metal channel lead can be in electrical contact with a semiconductor channel lead if the metal channel lead is either immediately over or under the semiconductor channel lead in another layer.

A part of a layer has "a structure that prevents formation of bubbles" at a side of the layer during an operation if the part's structure has a structural characteristic that prevents formation of bubbles. For example, if the operation is a high temperature operation such as production of a sensing element in a silicon-based layer, the structure can prevent formation of bubbles by reducing the production of gas, by permitting dissipation of gas, or by strengthening the structure so that gas cannot cause bubbles. If the part of the layer is a semiconductor channel lead formed in a silicon-based layer, for example, the structure can include sufficiently small amount of hydrogen to prevent formation of bubbles; can include grain structures that permit hydrogen to dissipate at a sufficient rate to prevent formation of bubbles; or can have interfaces sufficiently stable to prevent formation of bubbles.

A "sensing element" is a component that can receive a stimulus and can provide an electric signal indicating a measure of the received stimulus. The received stimulus could be electromagnetic radiation, pressure, temperature, chemicals, or any other stimulus that can be sensed and measured.

Similarly, a "sensor device" is a device that can receive information in a form other than electric signals and can provide an electric signal indicating the received information.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals, referred to as "data signals," that determine or indicate its state. Lines in the other direction may be "scan lines" through which a cell receives a signal, referred to as a "scan signal," enabling it to receive signals from or provide signals to its data line.

In an array of circuitry, "cell circuitry" is circuitry connected to a cell's scan line and data line.

A "sensor array" is a sensor device that receives information in the form of an image or pattern detected by an array of sensing elements.

A part of a layer "has an edge" if another, complementary part of the layer has been removed by one or more processes, leaving the part of the layer. The edge is the boundary between part of a layer and its complementary part.

Edges of two layers or parts of layers in a structure formed on a substrate are "approximately aligned" if their projections onto the surface of the substrate at which the structure is formed are approximately the same.

Edges of two layers or parts of layers are "self-aligned" if they are approximately aligned because one was produced by a lithographic process in which the other served as a mask. Accordingly, "self-aligned lithography" or "self-aligned lithographic patterning" is lithography that obtains approximate alignment between edges of two layers or parts of layers by using one layer as a mask in a process that patterns the other. In self-aligned lithography, "self-aligned backside exposure" is backside exposure in which part of a blocking layer between the resist layer and the substrate prevents radiation from reaching the resist layer so that the resulting exposure pattern in the resist layer can then be used to lithographically pattern a layer between the blocking layer and the resist layer.

In an alloy or other mixture of two or more elements, the relationship between the quantities of atoms of the elements can be expressed as an "atomic percent," an "atomic proportion," or an "atomic ratio."

B. General Features

Figure 2:
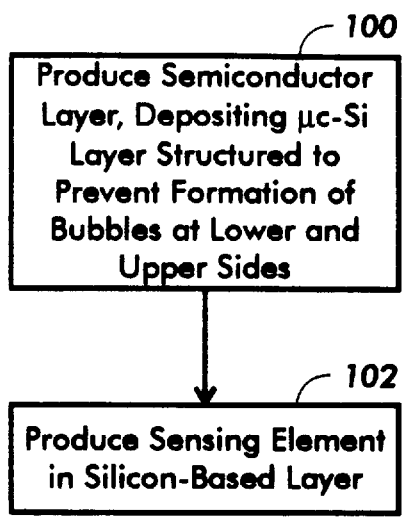
FIG. 2 is a flow chart showing general acts in a method that produces a semiconductor layer with μc-Si structured to prevent bubble formation during subsequent production of a sensing element in a silicon-based layer.
Figure 3:
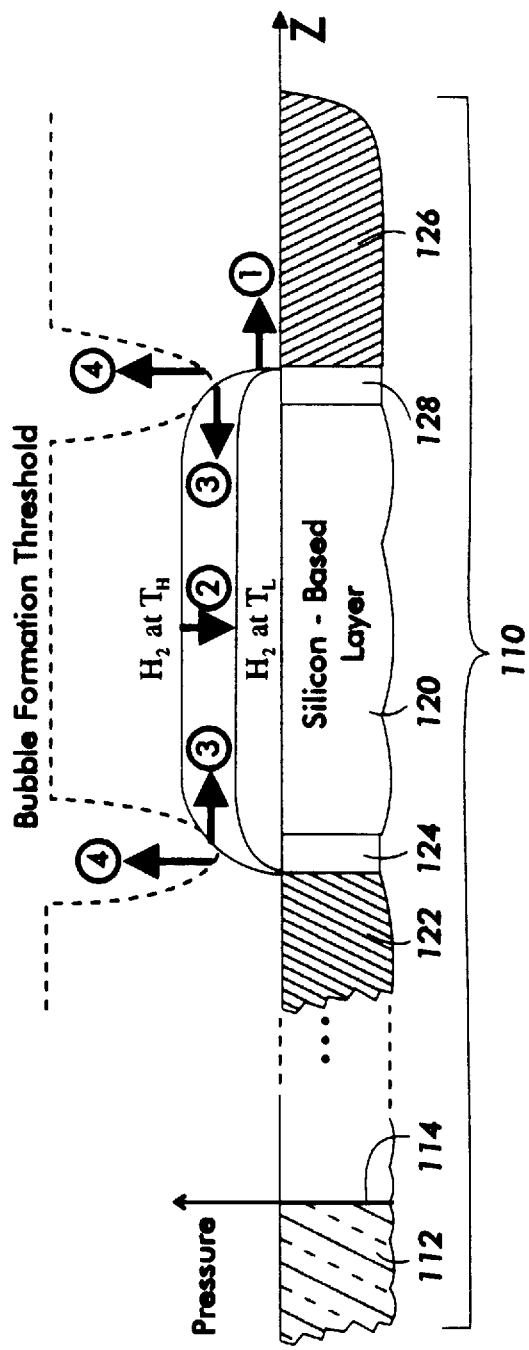
FIG. 3 is a schematic diagram showing relationships between hydrogen pressure and the pressure at which bubbles form across a silicon-based layer.
Figure 4:
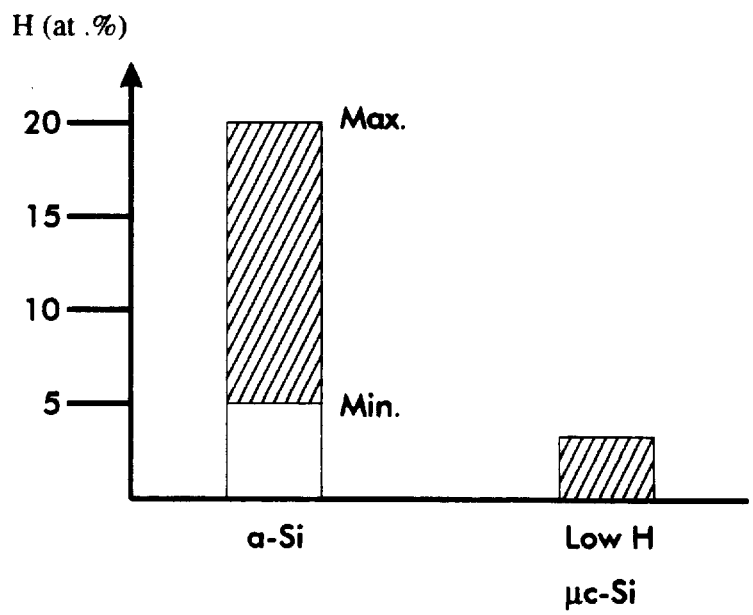
FIG. 4 is a graph showing ranges of atomic percentage of hydrogen in different silicon-based materials.
Figure 5:
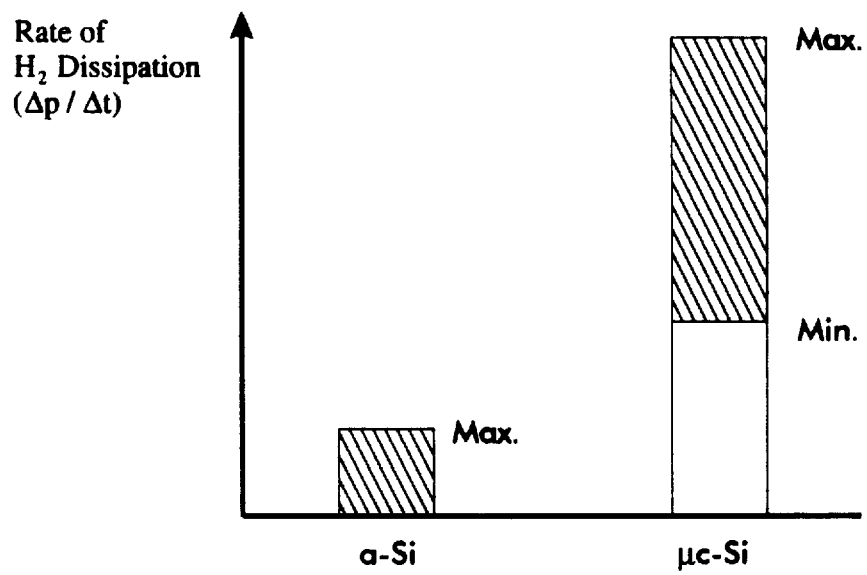
FIG. 5 is a graph showing ranges of pressure gradients in different silicon-based materials.
Figure 6:
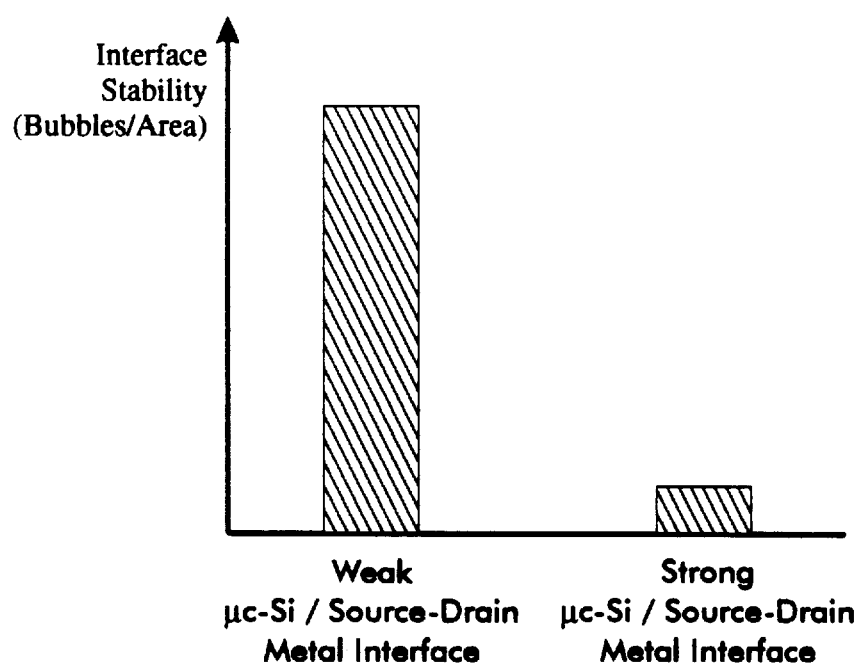
FIG. 6 is a graph showing interface stability for different interfaces between μc-Si and other materials.

FIGS. 2–6 show general features of the invention. FIG. 2 shows general acts in producing a semiconductor layer with $\mu$c-Si structured to prevent bubble formation during subsequent production of a sensing element. FIG. 3 shows relationships between hydrogen pressure and bubble formation threshold in a silicon-based layer. FIG. 4 shows a relationship between atomic percentage of hydrogen in a microcrystalline silicon layer and bubble formation. FIG. 5 shows a relationship between spacings between columnar microstructures in a microcrystalline silicon layer and bubble formation. FIG. 6 shows a relationship between interface stability and bubble formation.

The act in box 100 in FIG. 2 produces a semiconductor layer. In doing so, the act in box 100 deposits a µc-Si layer, and the µc-Si layer is structured to prevent formation of bubbles at the lower and upper sides of the semiconductor layer during subsequent production of a sensing element in a silicon-based layer.

The act in box 102 then produces a sensing element in a silicon-based layer over the semiconductor layer. Because of the structure of the µc-Si layer, the act in box 102 does not result in bubble formation at the lower and upper sides of the semiconductor layer.

The lower part of FIG. 3 shows a partial cross-section of structure 110, including substrate 112 with surface 114 on which layers have been formed and with distance in the z-dimension being measured upward from surface 114. Silicon-based layer 120 is over layer 122, with layers 120 and 122 meeting at interface 124. Similarly, layer 126 is over silicon-based layer 120, with layers 120 and 126 meeting at interface 128.

The upper part of FIG. 3 shows a graphical relationship between three measurements of gas pressure that vary in the z-dimension. The dashed curve at the top shows the gas pressure threshold above which bubbles form. Because each of layers 120, 122, and 126 has a high degree of structural stability, the bubble formation threshold within each layer is very high. But structure at interfaces 124 and 128 is not as stable, so that the bubble formation threshold dips—a relatively low gas pressure can cause a bubble to form at one of the interfaces.

The two solid curves show the pressure of hydrogen gas ($H_2$) at two temperatures, a lower temperature ($T_L$) and a higher temperature ($T_H$). As can be seen, the $H_2$ pressure at $T_L$ stays well below the bubble formation threshold, so that bubbles are very unlikely to form if the subsequent processing of structure 110 does not involve temperatures greater than $T_L$. But if subsequent processing requires temperatures as high as $T_H$, which could be a temperature that occurs in producing a sensing element in another silicon-based layer, $H_2$ pressure rises and it becomes likely that bubbles will form at one or both of the interfaces.

The arrows in the upper part of FIG. 3 suggest four specific approaches to preventing bubble formation. The first approach, illustrated by the arrow with the number "1" in a circle, modifies the structure of layer 126 so that $H_2$ from layer 120 can enter layer 126, reducing pressure at interface 128. An example of the first approach can be understood in relation to FIG. 1, in which layer 32 could be formed of a material that would permit hydrogen to dissipate at a rate that would prevent bubble formation. In contrast to the first approach, the other three approaches all involve changes in the structure of layer 120.

The second approach, illustrated by the arrow with the number "2" in a circle, provides layer 120 with a lower atomic percentage of H, so that less $H_2$ is generated at $T_H$. If the atomic percentage of H is sufficiently low, the $T_H$ curve of $H_2$ pressure does not reach the bubble formation threshold, and bubbles are unlikely to form at either of the interfaces.

The third approach, illustrated by the arrows with the number "3" in a circle, provides layer 120 with a structure that permits hydrogen to dissipate, so that the slope of the $T_H$ curve of $H_2$ pressure is less steep across interfaces 124 and 128. If the slope is sufficiently low, the $T_H$ curve again does not reach the bubble formation threshold, and bubbles are unlikely to form at either of the interfaces.

The fourth approach, illustrated by the arrows with the number "4" in a circle, provides layer 120 with a structure that provides more stability at interfaces 124 and 128. As a result, the bubble formation threshold rises at each of interfaces 124 and 128. If the interfaces are sufficiently stable that the $T_H$ curve does not reach the bubble formation threshold, bubbles are unlikely to form at either of the interfaces.

FIGS. 4, 5, and 6 illustrate respectively how the second, third, and fourth approaches can be followed if silicon-based layer 120 is a layer of µc-Si.

In the bar graph of FIG. 4, the vertical axis indicates atomic percentage of H. As shown, typical a-Si materials include between 5 and 20 atomic percent of H, while useful µc-Si material may have less than 5 atomic percent of H and typically has 1–3 atomic percent of H or less. Therefore, changing from a layer of a-Si to a layer of low H µc-Si can significantly reduce the atomic percentage of H. Because bubble formation correlates directly with the atomic percentage of H in a silicon-based material, reducing atomic percentage of H can prevent bubble formation.

In the bar graph of FIG. 5, the vertical axis indicates the rate of $H_2$ dissipation, which could be measured as $\Delta p/\Delta t$, where $\Delta p$ is an incremental difference in pressure and $\Delta t$ is an incremental time. As shown, the maximum rate of $H_2$ dissipation that can occur in typical a-Si materials is believed to be lower than the minimum that can occur in µc-Si materials, as a result of crystalline grain structures in µc-Si. The crystalline grain structures are relatively dense and are surrounded by less dense material. Although $H_2$ movement is inhibited within the dense material of the grain structures, the grain boundaries and the less dense material are believed to have higher mobility for hydrogen, permitting hydrogen to dissipate.

Across the spectrum of crystalline grain structure size varying from very small in some µc-Si to very large in single crystal silicon, the rate of $H_2$ dissipation is believed to increase as crystalline grain structures increase in size from a-Si to µc-Si, reaching maximum at microstructure sizes characteristic of some µc-Si or poly-Si, and then decreasing again before the size approaches that of single crystal silicon. The rate of $H_2$ dissipation is also believed to vary with crystalline grain structure shape, with columnar structures permitting faster dissipation than spherical shapes. Therefore, if the crystalline grain structures in µc-Si have appropriate sizes and shapes, $H_2$ dissipates rapidly, making it less likely that the bubble formation threshold will be reached.

In the bar graph of FIG. 6, the vertical axis indicates interface stability, which could be measured in bubbles per unit of area. As shown, a weak interface between µc-Si and source-drain metal results in significantly more bubbles per unit of area than a strong interface between the same materials. A weak interface can be produced, for example, by the presence of oxide or other substances on a µc-Si surface before source-drain metal is deposited over it or by waiting for an extended period of time, such as a few days, to deposit source-drain metal on a µc-Si surface, permitting oxide to form. Therefore, if the µc-Si/source-drain metal interface is structured with sufficient stability, the bubble formation threshold at the interface increases, making it less likely that the bubble formation threshold will be reached.

C. Implementations

The general features described above could be implemented in numerous ways. The implementations described below provide active matrix sensor arrays with TFTs as switching elements.

C.1. Sensor Array

Figure 7:
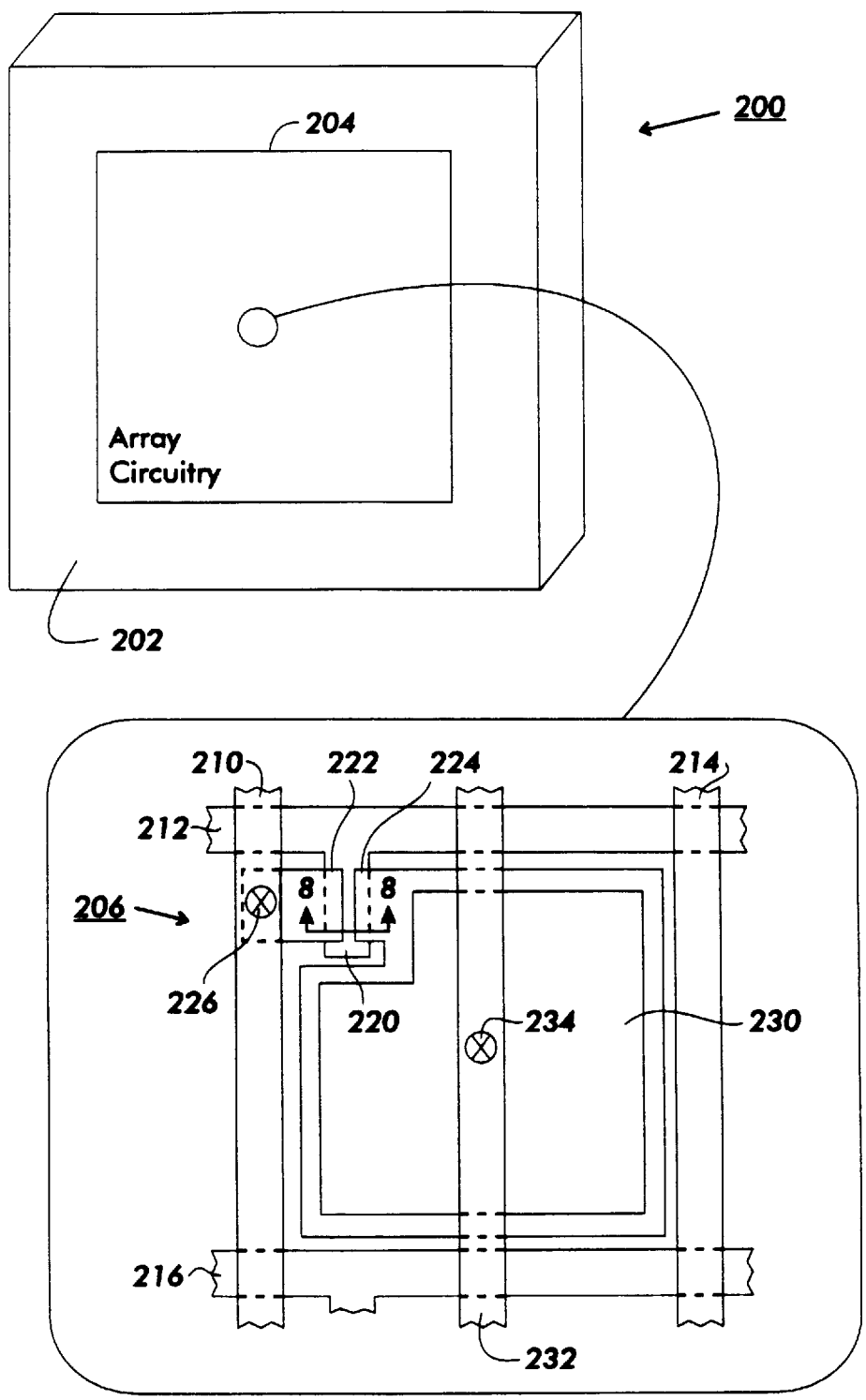
FIG. 7 is a schematic diagram showing a sensor array and a layout of a cell's circuitry in the array.

FIG. 7 shows a sensor array in which channel leads are formed in microcrystalline silicon to prevent bubble formation.

Array 200 in FIG. 7 includes glass substrate 202 at a surface of which array circuitry 204 is formed. Array circuitry 204 includes cells, with representative cell 206 being shown in more detail.

Cell 206 includes cell circuitry that provides signals on data line 210 in response to scan signals on scan line 212. The components that form the cell circuitry are also bounded by data line 214 and scan line 216.

Gate 220, formed in the same layer as scan lines 212 and 216 and electrically connected to scan line 212, extends under a channel of an a-Si TFT, as explained below in relation to FIG. 8. Over gate 220, channel leads 222 and 224 are formed, each with an n+ $\mu$c-Si semiconductor lead and a conductive metal lead. As shown, channel lead 222 has electrical connection 226 to data line 210, which can be formed through an opening in an insulating layer between channel lead 222 and data line 210.

The layers that form channel lead 224 can cover nearly all the area bounded by data lines 210 and 214 and scan lines 212 and 216. Over channel lead 224 is sensing element 230, with a diode formed in a semiconductor layer and with an electrode formed in a conductive metal layer. Bias line 232, formed in the same layer as data lines 210 and 214, has electrical connection 234 to the electrode of sensing element 230.

C. 2. Deposited Doped $\mu$c-Si Layer

Figure 8:
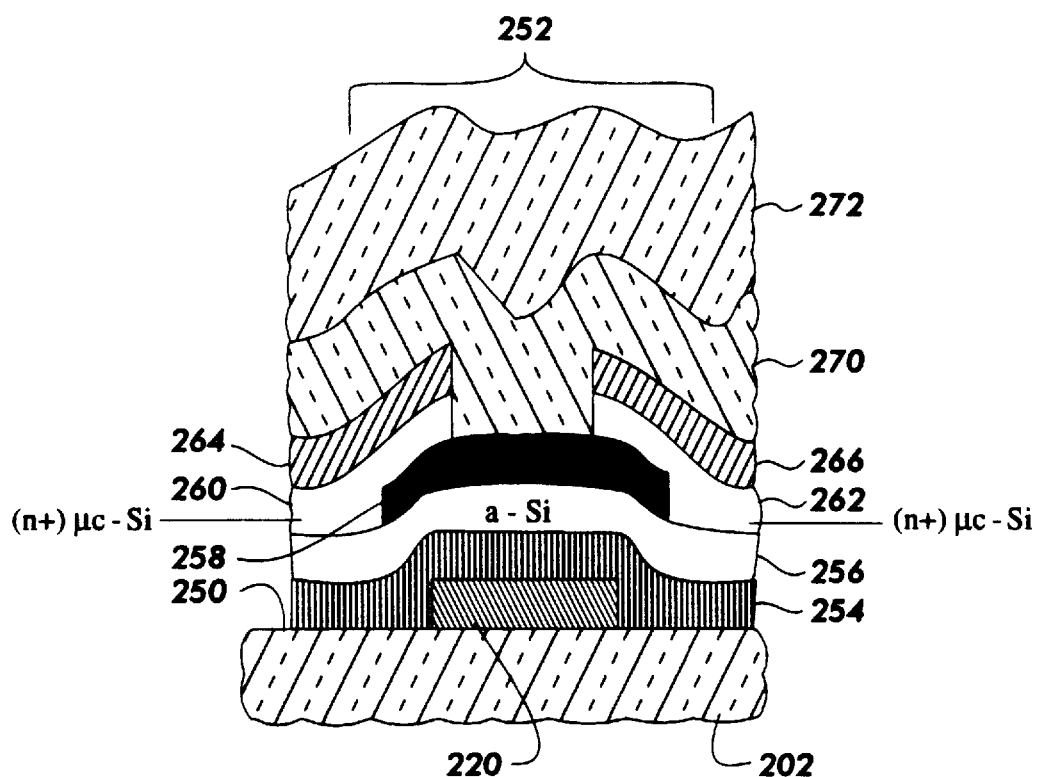
FIG. 8 is a cross-section of a TFT in the cell circuitry of FIG. 7, taken along line 8—8 in FIG. 7.
Figure 9:
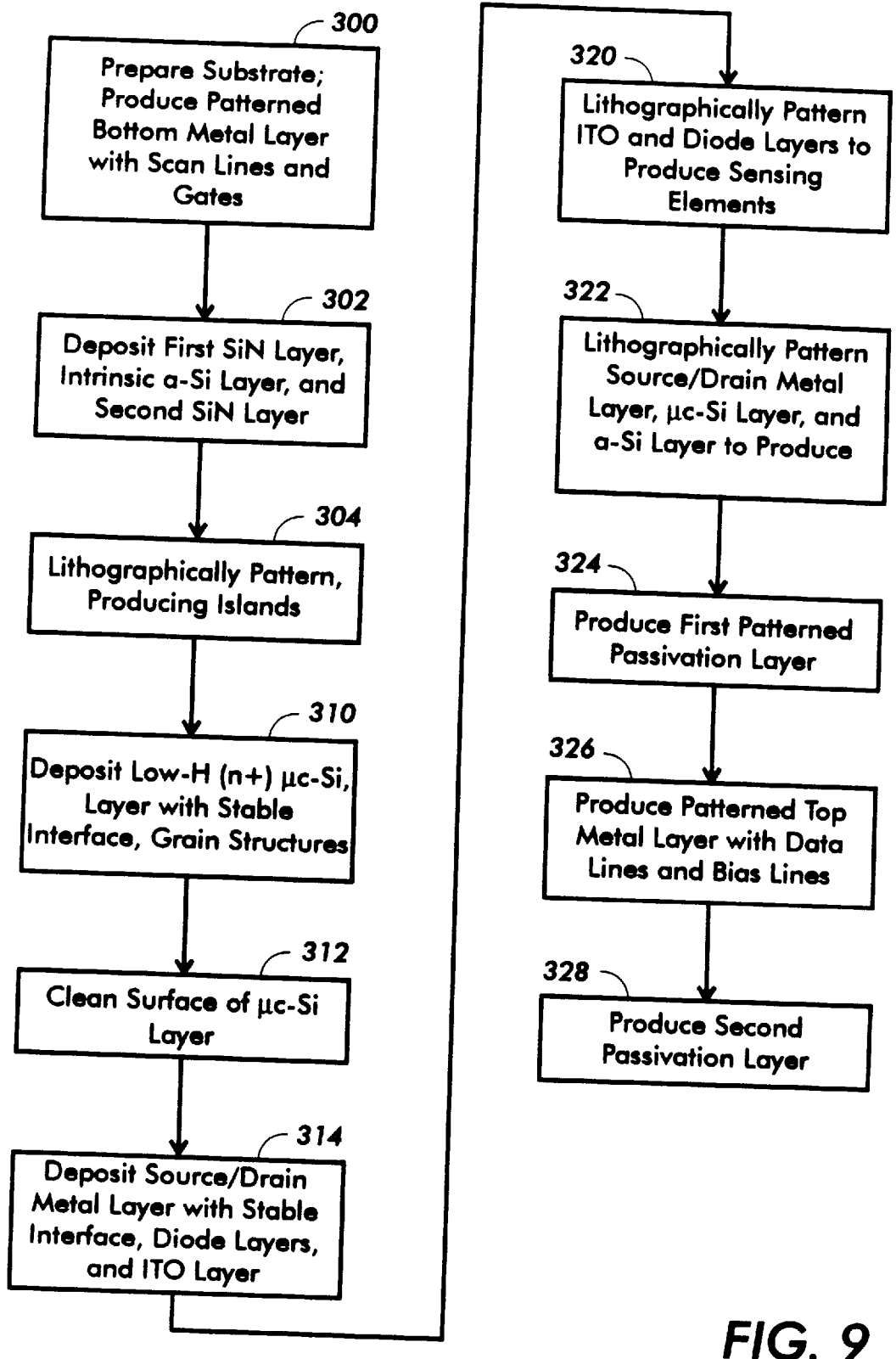
FIG. 9 is a flow chart showing acts in producing the array of FIG. 7.

FIG. 8 shows a cross section of the array of FIG. 7 along the line 8—8, illustrating an implementation with a layer of doped $\mu$c-Si. FIG. 9 shows acts in fabricating array 200 in FIG. 7 with a layer of doped $\mu$c-Si as in FIG. 8.

The cross section in FIG. 8 shows glass substrate 202 with surface 250 at which TFT 252 is formed. Gate 220 is formed on surface 250, and is electrically connected to scan line 212 as shown in FIG. 7.

Insulating layer 254, a layer of SiN, separates gate 220 from intrinsic semiconductor layer 256, the layer of a-Si in which the channel of TFT 252 is formed. Semiconductor layer 256 is covered in the channel region by insulating island 258, another layer of SiN.

Semiconductor leads 260 and 262 are formed in a layer of n+ $\mu$c-Si, and are in electrical contact with the connecting regions of the channel at either side of island 258. Metal leads 264 and 266 are formed in a layer of chromium or another conductive metal. Together, semiconductor lead 260 and metal lead 264 form one channel lead of TFT 252, while semiconductor lead 262 and metal lead 266 form the other channel lead.

FIG. 8 also shows lower passivation layer 270 and upper passivation layer 272, each a layer of silicon oxynitride.

The acts in FIG. 9 are similar to those described in relation to FIG. 6 of copending, coassigned U.S. patent application Ser. No. 08/474,845, entitled "Array Circuitry with Conductive Lines, Contact Leads, and Storage Capacitor Electrode All Formed in Layer that Includes Highly Conductive Metal" ("the Single Layer Application"), incorporated herein by reference.

The act in box 300 in FIG. 9 can begin by preparing surface 250 of substrate 202, which can be a glass substrate such as Corning 7059 glass. The act in box 300 can include any necessary cleaning. The act in box 300 then produces the first patterned conductive layer, with scan lines 212 and 216 and gate 220. For example, as described in the Single Layer Application, the act in box 300 can produce aluminum shunts 8 $\mu$m wide and 800 Å thick; then the act in box 300 can sputter deposit an alloy of titanium tungsten to a thickness of about 1200 Å, then use photolithographic techniques to produce a mask and etch to obtain scan lines approximately 14 $\mu$m wide and other features as in FIG. 7.

The act in box 300 could alternatively use other techniques. For example, the first conductive layer could include sputter deposited MoCr, or a multilayered structure of alternating layers of Al and TiW, or Al with a dual dielectric capping layer, including low temperature deposited SiON and high temperature plasma enhanced chemical vapor deposited (PECVD) SiN. These techniques are discussed in greater detail in copending, coassigned U.S. patent application Ser. No. 08/235,008, entitled "Thin-Film Structure with Conductive Molybdenum-Chromium Line"; in U.S. Pat. No. 5,518,805, entitled "Hillock-Free Multilayer Metal Lines for High Performance Thin Film Structures"; and in coassigned U.S. patent application Ser. No. 08/512,267, entitled "Dual Dielectric Capping Layers for Hillock Suppression in Metal Layers in Thin Film Structures", all of which are incorporated by reference.

The act in box 302 then produces insulating layer 254, intrinsic semiconductor layer 256, and the insulating layer that includes island 258 by a sequence of PECVD steps. Insulating layer 254 can be silicon nitride deposited at about 300–380 degrees C. to a thickness of about 3000 Å. Intrinsic semiconductor layer 256 can be a layer of intrinsic a-Si that includes 5–12% hydrogen and is deposited at about 230–300 degrees C. to a thickness of about 300–500 Å; intrinsic semiconductor layer 256 can alternatively be a layer of intrinsic $\mu$c-Si deposited as described below in relation to box 310 but without PH$_3$; or intrinsic semiconductor layer 256 could be an appropriately formed layer of intrinsic poly-Si. The upper insulating layer that includes island 258 can be silicon nitride deposited primarily as an etch stop at 200–250 degrees C. to a thickness of about 1000–1500 Å.

The act in box 304 patterns the upper insulating layer to produce island 258. The act in box 304 can use photolithographic techniques to produce islands by exposing a photoresist layer using a photolithographic mask and by then etching to remove exposed areas of photoresist and then exposed portions of the upper insulating layer. The act in box 304 can also include cleaning, such as conventional cleaning with a wet etch, to remove native oxide so that a stable interface can be formed with a layer of $\mu$c-Si. Care should be taken to avoid creation of defects that would weaken the interface.

The act in box 310 deposits a layer of low-H n+ $\mu$c-Si over the cleaned surface of layer 256 and island 258. The act in box 310 can deposit $\mu$c-Si by first performing plasma enhanced CVD at 0.1–2.0 Torr. with 2% a mixture of SiH$_4$ and PH$_3$, and the other 98% H$_2$, at a high deposition power and 13.56 megahertz r.f. to deposit a heavily n+ doped $\mu$c-Si layer at 200°–300° C. with 1–3 at. % hydrogen to a thickness of 500–1000 angstroms. The PH$_3$-SiH$_4$ mixture can have 0.5–5.0% PH$_3$. The $\mu$c-Si layer should be thick enough to be sufficiently conductive to function as a channel lead. The proportions of gases should be chosen to obtain an appropriate grain size and an appropriate level of dopant. The $\mu$c-Si layer can be doped, for example, with 0.5–5.0% phosphorous. The $\mu$c-Si should be developed so that microcrystalline grain structures such as columnar grain structures permit hydrogen to dissipate and prevent bubble formation.

The act in box 312 dips the layer of μc-Si from box 310 in an appropriate solvent, such as dilute HF, to remove oxide. This act helps to ensure that a stable interface can be formed with the next layer. Alternatively, an RF backsputter could be performed to remove oxide. The act in box 312 can also include cutting openings to peripheral pads.

The act in box 314 deposits a series of layers in which sensing elements can be formed. The first layer is the source/drain metal in which metal channel leads 264 and 266 are formed; this can be a sputtered layer of chromium, which forms a stable interface with the μc-Si layer. The next layers are the layers of a diode, and can be a conventional p-i-n layer or Schottky diode layer, deposited in either case by plasma-enhanced chemical vapor deposition (PECVD) at temperatures of 200–250 degrees C. The final layer is a layer of highly conductive, transparent material in which the sensing element's upper electrode is formed; this can be a layer of indium-tin-oxide (ITO), deposited using reactive sputter techniques in 0.5–1.5% $O_2$ to a thickness of about 500–1000 Å.

The act in box 320 patterns the ITO and diode layers to produce the sensing element. The act in box 320 can use photolithographic techniques, exposing a photoresist layer using a photolithographic mask and then etching to remove exposed areas of photoresist and then exposed portions of the ITO and diode layers. The act in box 320 can also anneal the ITO layer at a temperature of 200–230 degrees C. for approximately one hour. The act in box 320 can also cut openings to the chromium layer over peripheral pads.

The act in box 322 patterns the source/drain metal layer, the μc-Si layer, and the intrinsic a-Si layer to complete transistor 252. The act in box 322 can similarly use photolithographic techniques, exposing a photoresist layer using a photolithographic mask and then etching to remove exposed areas of photoresist and then exposed portions of the the source/drain metal layer, the μc-Si layer, and the intrinsic a-Si layer. Island 258 acts as an etch stop, to prevent etching of the channel of TFT 252.

The act in box 324 produces lower passivation layer 270 with openings for electrical connections 226 and 234. The act in box 324 can deposit a passivation material such as silicon oxynitride to a thickness of 6000 Å or thicker if necessary to reduce coupling. The act in box 324 can then use photolithographic techniques to mask and then etch the resulting layer to produce an opening exposing part of metal lead 264 and part of the electrode of sensing element 230 in each unit of cell circuitry.

The act in box 326 produces the patterned top metal layer with data lines 210 and 214 and bias line 232. The act in box 326 can sputter deposit a thin layer of titanium tungsten to a thickness of approximately 500 Å, followed by a thicker layer of aluminum to a thickness of 4000–5000 Å, and capped by a final layer of titanium tungsten to a thickness of approximately 500–1000 Å. These three metal layers can be sputter deposited in sequence in a chamber without breaking the vacuum between depositions. The act in box 316 can then use photolithographic techniques to mask and then etch the resulting layer, first etching titanium tungsten with $H_2O_2$, followed by a standard aluminum etch, and finally etching titanium tungsten again with $H_2O_2$.

The act in box 328 produces upper passivation layer 272. The act in box 328 can deposit a passivation material such as silicon oxynitride to a thickness of 6000 Å or thicker if necessary to reduce coupling. The act in box 328 can also cut openings to peripheral pads so that connections can be made.

The technique of FIG. 9 can include further conventional acts (not shown) to cut through layer 272 to contact pads, to coat the array with x-ray sensitive material such as selenium and arsenic, and to otherwise complete the manufacturing process.

C. 3. Results

The implementation described above in relation to FIGS. 7–9 has been partially implemented experimentally by producing sensor structures with doped μc-Si layers having 2–3 at. % hydrogen and by also producing TFTs that include such layers. Analysis of the μc-Si layers shows the presence of crystalline grain structures observable using SEM or TEM imaging and the prevention of bubble formation across a wider range of process temperatures than is possible with a-Si layers. TFTs according to the above implementation are operable and sensor structures function to sense visible light.

C. 4. Channel and Leads in the Same μc-Si Layer

Figure 10:
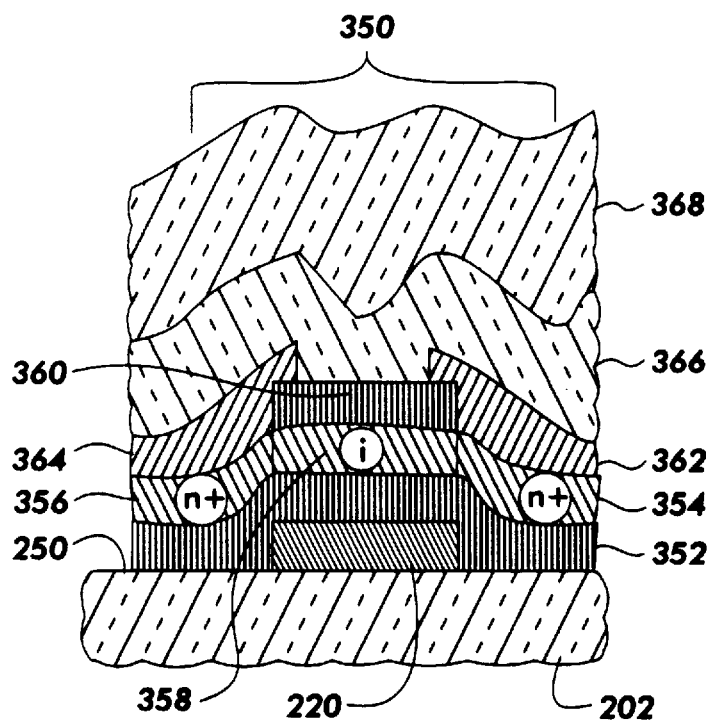
FIG. 10 is a cross-section of an alternative TFT that could be used in the cell circuitry of FIG. 7.
Figure 11:
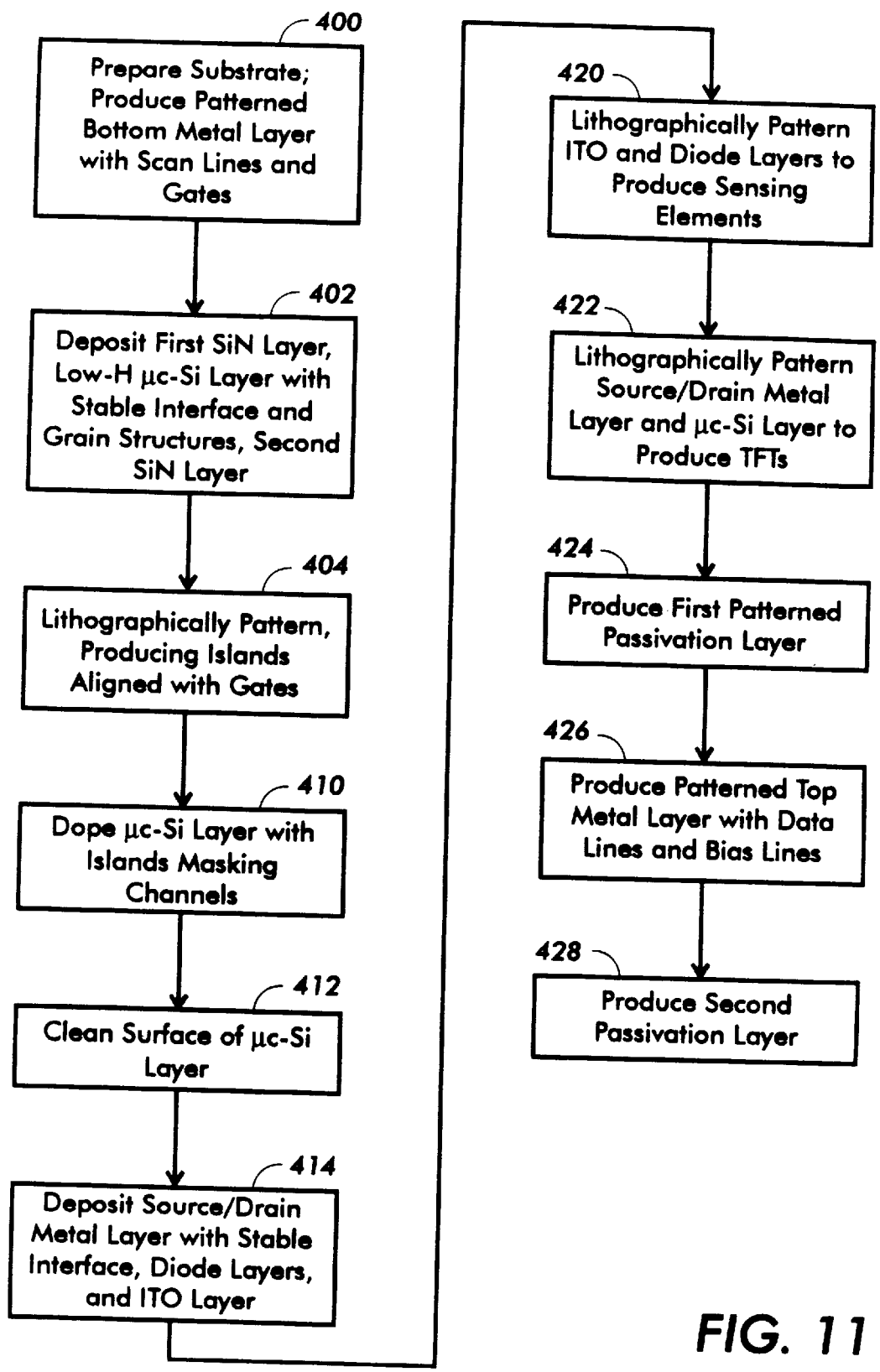
FIG. 11 is a flow chart showing acts in producing an array with TFTs as in FIG. 10.

FIG. 10 shows a cross section of the array of FIG. 7 along the line 8—8, illustrating an alternative implementation with a layer of μc-Si that includes a channel as well as doped semiconductor leads. FIG. 11 shows acts in fabricating array 200 in FIG. 7 with a layer of μc-Si as in FIG. 10.

The cross section in FIG. 10 shows glass substrate 202 with surface 250 at which TFT 350 is formed. As in FIG. 8, gate 220 is formed on surface 250, and is electrically connected to scan line 212 as shown in FIG. 7.

Insulating layer 352, a layer of SiN, separates gate 220 from a μc-Si layer that includes $n^+$ semiconductor channel leads 354 and 356 and intrinsic channel 358. Leads 354 and 356 are in electrical contact with connecting regions of channel 358 within the μc-Si layer. The μc-Si layer is covered in the channel region by insulating island 360, formed in another layer of SiN with its edges aligned with the edges of gate 220.

As in FIG. 8, metal leads 362 and 364 are formed in a layer of chromium or another conductive metal. Together, semiconductor lead 354 and metal lead 362 form one channel lead of TFT 350, while semiconductor lead 356 and metal lead 364 form the other channel lead.

FIG. 10 also shows lower passivation layer 366 and upper passivation layer 368, each a layer of silicon oxynitride.

The acts in FIG. 11 are similar to those described above in relation to FIG. 9. The acts in boxes 400, 412, 414, 420, 424, 426, and 428 can be implemented as described above in relation to boxes 300, 312, 314, 320, 324, 326, and 328 in FIG. 9.

The act in box 402 produces insulating layer 352, the μc-Si layer that includes semiconductor leads 354 and 356 and channel 358, and the insulating layer that includes island 360 by a sequence of PECVD steps. Insulating layer 352 can be silicon nitride deposited as described in relation to layer 254. The μc-Si layer can be deposited as described in relation to the μc-Si layer in FIG. 8, but without $PH_3$ so that the deposited μc-Si is undoped. The upper insulating layer that includes island 360 can be silicon nitride deposited as described in relation to the upper insulating layer that includes island 258 in FIG. 8.

The act in box 404 patterns the upper insulating layer to produce island 360. The act in box 404 can use self-aligned lithographic techniques to produce self-aligned islands by performing self-aligned backside exposure of a photoresist layer using gate 220 as a mask and by then etching to remove exposed areas of photoresist and then exposed portions of the upper insulating layer.

The act in box 410 then dopes semiconductor leads 354 and 356, such as by performing ion implantation or ion shower doping with an appropriate dopant. As a result, semiconductor leads 354 and 356 are conductive. Island 360 acts as a mask to prevent dopant particles from reaching channel 358, however, so that channel 358 remains intrinsic.

The act in box 422 patterns the source/drain metal layer, such as with a wet etchant, and then patterns the μc-Si layer, such as with a plasma etchant, to complete transistor 350. The act in box 422 can be implemented as described in relation to box 322 in FIG. 9, but without etching layers below the source/drain metal layer.

C. 5. Variations

The implementations described above could be changed in many ways within the scope of the invention.

The implementations described above perform specific acts in specific sequences, but the invention could be implemented with other acts and the acts could be performed in other sequences.

The implementations described above provide thin film circuitry on an insulating substrate, such as quartz or glass. The invention could be implemented with other types of circuitry on other types of substrates.

The implementations described above provide circuitry with specific geometric and electric characteristics, but the invention could be implemented with different geometries and with different circuitry.

The implementations described above produce layers of specified thicknesses, produced from specified materials by specified processes, but other thicknesses could be produced, and other materials and processes could be used.

Specifically, the implementations described above produce layers of μc-Si with specified PECVD processes. Other low temperature processes could be used, including sputtering or evaporating silicon in a high hydrogen environment, other gases could be used in the PECVD process, such as mixtures of $SiH_4$ with $F_2$ or of $SiF_4$ with $H_2$, and other PECVD processes could be used, such as remote plasma processes. Similarly, other processes could be used to produce the amorphous silicon layers in the sensor, including sputtering and evaporation. All the silicon-based layers could be produced with PECVD, or all could be produced with sputtering, all could be produced with evaporation, or any combination of PECVD layers, sputtered layers, and evaporated layers could be produced.

Various conductive materials could be used in the layer that includes source/drain metal leads and the lower sensing element electrodes, including but not limited to any appropriate metal or alloy such as Al with or without layers or barrier metals, alloys of Al including Al-Si and alloys of Al with other metals, ITO, MoTa, Cr, MoCr, Ta, Cu, Ti, TiN, W, hybrid multilayer stacks such as TiW/AlCu, and any appropriate organic conductive materials.

Various conductive materials could also be used in the upper sensing element electrodes, with ITO being appropriate in an x-ray sensor array with a selenium coating because it provides a blocking contact that blocks injection of charge carriers into the selenium coating at high voltages; further, ITO is transparent, which may be useful in certain applications. In appropriate contexts, sensing element electrodes could be formed in Al and its alloys or a refractory metal, such as chromium, titanium, tungsten, or molybdenum, or their alloys, or even a heavily doped conductive semiconductor layer.

Also, various conductive materials could be used in the scan lines and data lines, including but not limited to any appropriate metal or alloy such as Al with or without layers or barrier metals, alloys of Al including Al-Si and alloys of Al with other metals, ITO, MoTa, Cr, MoCr, Ta, Cu, Ti, TiN, W, hybrid multilayer stacks such as TiW/AlCu, and any appropriate organic conductive materials. Similarly, various dielectric materials could be used in the insulating layers, including but not limited to any appropriate silicon-based dielectric material, such as SiN, $SiO_xN_y$, or $Si_xO_y$, or any other dielectric material, such as $Ta_xO_y$ or $Al_xO_y$, or any appropriate multilayer dielectric structure.

The implementations described above produce layers in specific sequences, but the sequences of layers could be modified. Similarly, any appropriate arrangement of components in each unit of cell circuitry could be used.

The implementations described above are appropriate for an x-ray sensor array using any appropriate scintillator material. The scintillator could be thallium bromide, cesium iodide, lead iodide, or another appropriate material. In addition, the invention could be used in sensor arrays for radiation in other frequency bands detectable by a-Si based sensors. For example, the invention could be used with an a-Si photosensitive layer in a visible light sensor array as described in copending, coassigned U.S. patent application Ser. No. 08/483,406, entitled "Solid State Sensor Array," incorporated by reference.

D. Application

The invention could be applied in many ways, including production of arrays for sensors of various bands of radiation, including x-rays and light in the visible or near-visible range.

A small, high resolution x-ray sensor array could be produced for mammographic imaging, while a larger, low resolution x-ray sensor array could be produced as a film replacement in other diagnostic radiology applications. X-ray sensor arrays could also be produced for luggage inspection, and other nondestructive imaging applications.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. Therefore not limited by the description contained herein or by the drawings, but only by the claims.

What is claimed:

1. A method of forming circuitry at a surface of a substrate, the method comprising:

forming a gate lead;

depositing a first insulating layer over the gate lead;

depositing a first semiconductor layer over the first insulating layer; the first semiconductor layer including intrinsic microcrystalline silicon and having lower and upper sides and less than 5 atomic percent of hydrogen;

depositing a second insulating layer over the first semiconductor layer and patterning the second insulating layer to form an insulating island over a channel region in the first semiconductor layer; the channel region extending between a first connecting region and a second connecting region in the first semiconductor layer; the first and second connecting regions being adjacent to the insulating island and being exposed by the act of patterning the second insulating layer;

doping exposed parts of the first semiconductor layer using the insulating island as a mask to form first and second conductive regions immediately adjacent the first and second connecting regions, respectively;

depositing a conductive metal layer over the insulating island and exposed parts of the first semiconductor layer;

patterning the conductive metal layer and the first and second conductive regions of the first semiconductor layer to form first and second channel leads of a thin film transistor with a channel formed in the channel region in the first semiconductor layer; the first and second channel leads including first and second semiconductor leads, respectively, in the first semiconductor layer; the first semiconductor lead being in electrical contact with the first connecting region; the second semiconductor lead being in electrical contact with the second connecting region;

depositing a second semiconductor layer over the conductive metal layer; the second semiconductor layer including silicon-based material; and patterning the second semiconductor layer to form a sensing element; the conductive metal layer being exposed over the insulating island and over the first and second connecting regions by the act of patterning the second semiconductor layer; the first channel lead of said thin film transistor being electrically connected for receiving signals from the sensing element through the conductive metal layer; the thin film transistor responding to signals from the gate lead by providing signals received from the sensing element to the second channel lead of said thin film transistor;

the method being performed so that the first semiconductor layer has a structure that prevents formation of bubbles at the lower and upper sides of the first semiconductor layer during the acts of depositing and patterning the second semiconductor layer.

2. The method of claim 1 in which the layer of microcrystalline silicon is deposited with 1–3 atomic percent of hydrogen.

3. The method of claim 1 in which the layer of microcrystalline silicon is deposited with 2–3 atomic percent of hydrogen.

\* \* \* \* \*